(12) United States Patent
Hsu et al.

(10) Patent No.: US 7,960,835 B2
(45) Date of Patent: Jun. 14, 2011

(54) FABRICATION OF METAL FILM STACKS HAVING IMPROVED BOTTOM CRITICAL DIMENSION

(75) Inventors: Han-Hui Hsu, Tainan (TW); Ta-Hung Yang, Hsin-Chu (TW); Shih-Ping Hong, Taichung (TW); Ming-Tsung Wu, Shoufong Township, Hualien County (TW); An-Chi Wei, Hsinchu (TW); Ching-Hsiung Li, Hsin-Chu (TW); Kuo-Liang Wei, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 157 days.

(21) Appl. No.: 12/435,336

(22) Filed: May 4, 2009

(65) Prior Publication Data

US 2010/0276807 A1    Nov. 4, 2010

(51) Int. Cl.
*H01L 23/48*    (2006.01)
(52) U.S. Cl. .......... 257/771; 257/774; 257/E23.01; 257/E21.029; 257/E21.495; 438/618

(58) Field of Classification Search .......... 257/771, 257/774, E23.01, E21.029, E21.495; 438/618
See application file for complete search history.

(56) References Cited

U.S. PATENT DOCUMENTS

| | | | |
|---|---|---|---|
| 5,801,096 A * | 9/1998 | Lee et al. | 438/636 |
| 5,946,600 A | 8/1999 | Hurwitz et al. | |
| 6,133,142 A * | 10/2000 | Tran et al. | 438/625 |
| 6,262,478 B1 | 7/2001 | Hurwitz et al. | |
| 6,297,557 B1 * | 10/2001 | Bothra | 257/767 |
| 6,383,914 B1 | 5/2002 | Yasuda | |
| 7,358,592 B2 * | 4/2008 | Ueno | 257/536 |
| 2005/0227378 A1 * | 10/2005 | Moise et al. | 438/3 |

FOREIGN PATENT DOCUMENTS

| | | |
|---|---|---|
| TW | 419711 | 1/2001 |
| TW | 200504927 | 2/2005 |
| TW | I291705 B | 12/2007 |

* cited by examiner

*Primary Examiner* — Trung Dang
(74) *Attorney, Agent, or Firm* — Stout, Uxa, Buyan & Mullins, LLP

(57) ABSTRACT

A method of fabricating metal film stacks is described that reduces or eliminates adverse effects of photolithographic misalignments. A bottom critical dimension is increased by removal of a bottom titanium nitride barrier.

20 Claims, 6 Drawing Sheets

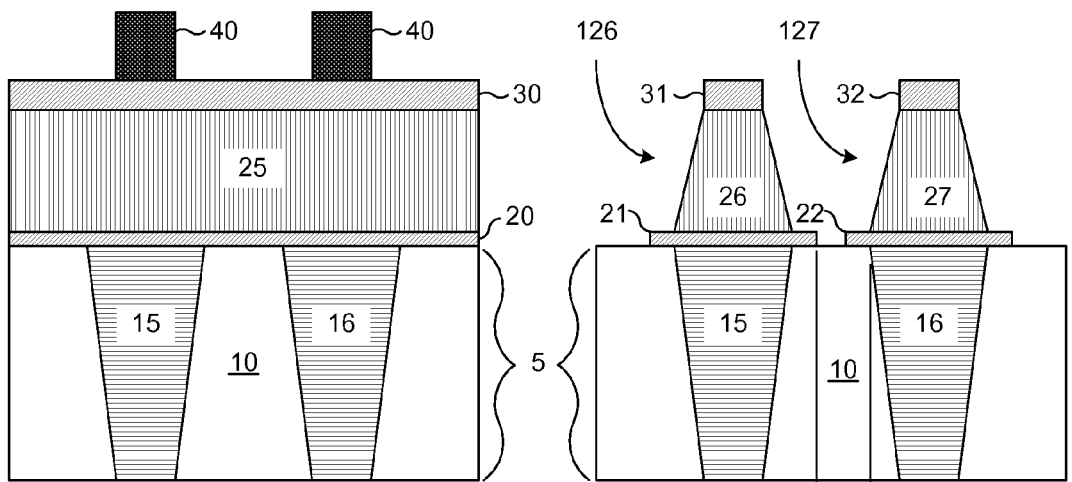
FIG. 2A
(Prior Art)
FIG. 2B
(Prior Art)
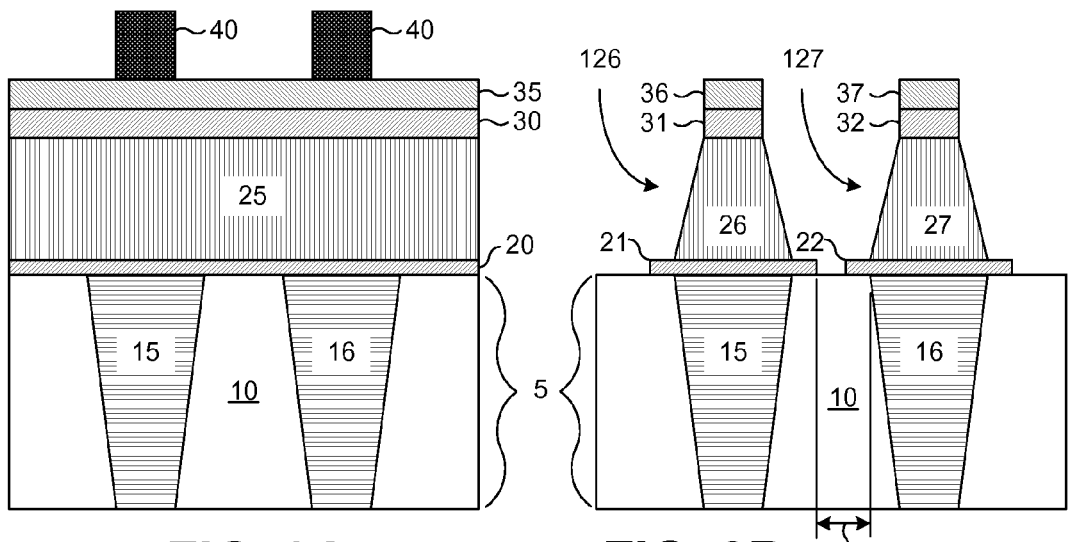
FIG. 3A
(Prior Art)
FIG. 3B
(Prior Art)

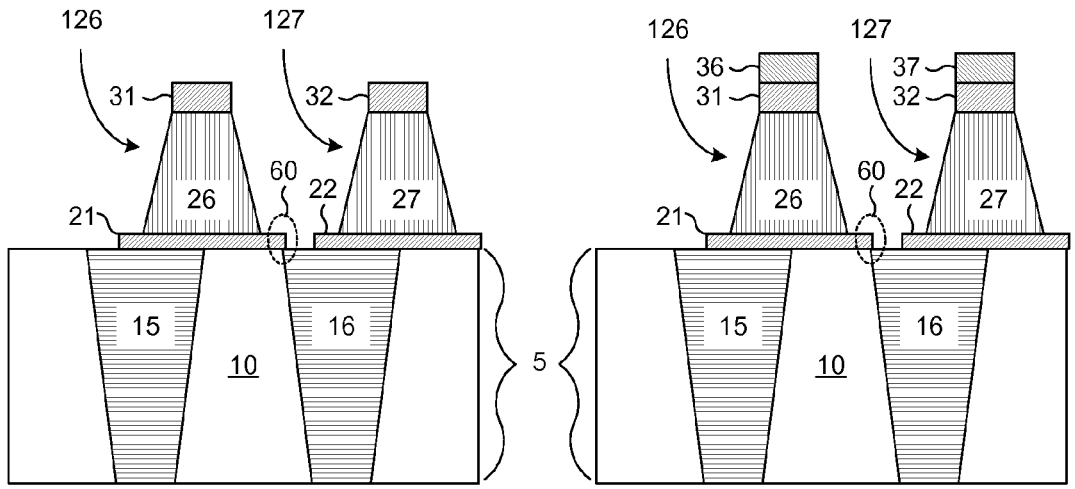
**FIG. 4
(Prior Art)**
**FIG. 5
(Prior Art)**
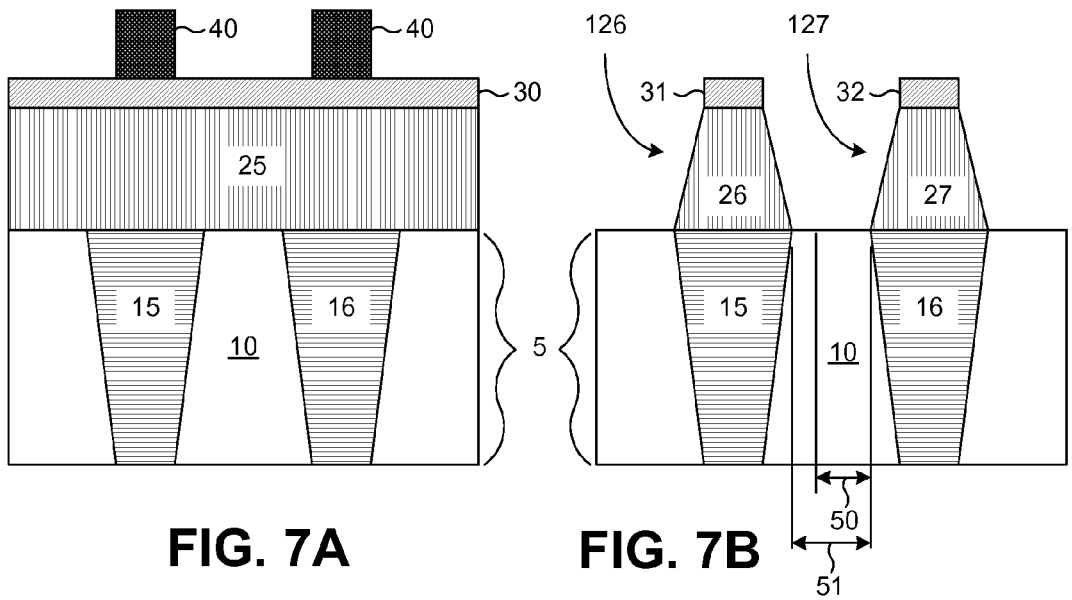
FIG. 7A
FIG. 7B

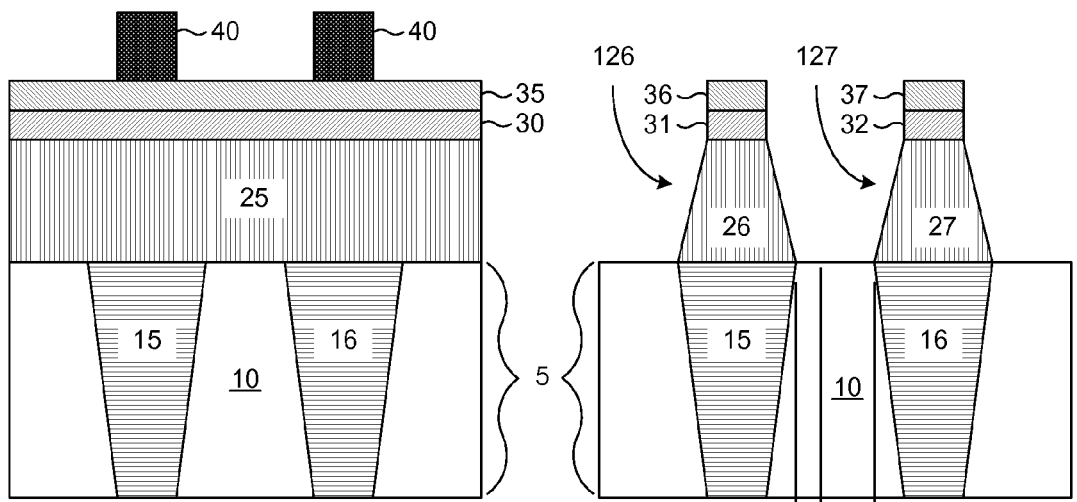
FIG. 9A  FIG. 9B
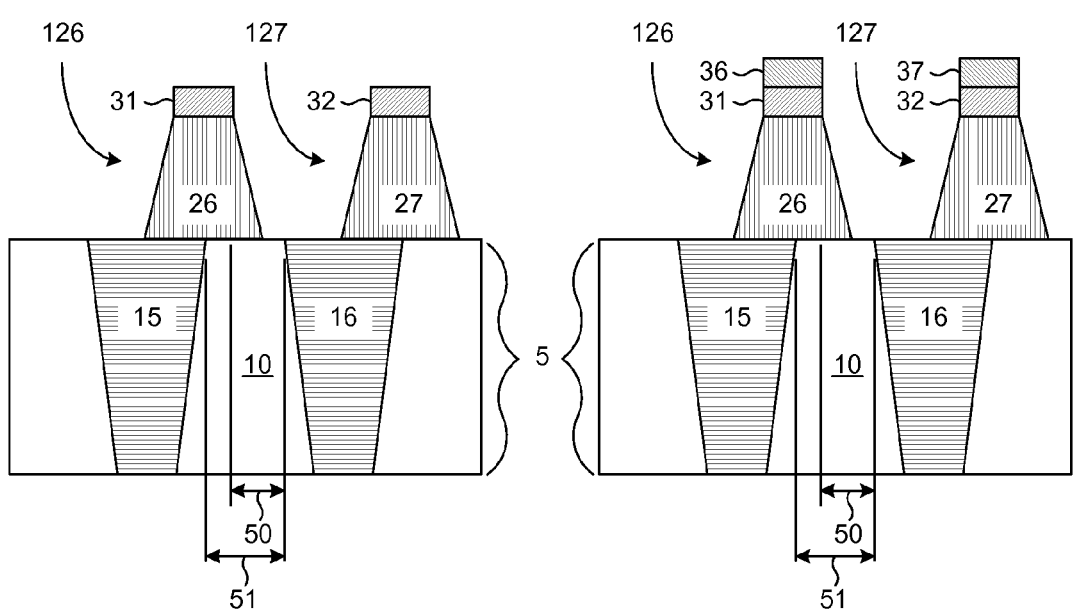
FIG. 10  FIG. 11

FABRICATION OF METAL FILM STACKS HAVING IMPROVED BOTTOM CRITICAL DIMENSION

BACKGROUND OF THE INVENTION

1. Field of the Invention

The present invention relates generally to semiconductors and, more particularly, to semiconductor fabrication methods for improving critical dimensions in metal film stacks.

2. Description of Related Art

Metal film stacks are employed in integrated circuits to connect lower elements lying below an interconnect structure to upper elements lying above the metal film stacks. For example, FIG. 2B illustrates two prior-art metal film stacks in the form of a left metal film stack 126 and a right metal film stack 127 that connect to, respectively, left and right conducting plugs 15 and 16 in an interconnect structure 5. Lower elements (not shown) may be located below the interconnect structure 5, and upper elements (likewise not shown) may be located above the metal film stacks 126 and 127. During fabrication, a registration error exceeding a critical dimension in a photolithographic process may result in misalignment of the metal film stacks with the conducting elements (e.g., via plugs) in such an interconnect structure, thereby adversely affecting or even destroying functionality of a portion of the integrated circuit. Typical constructions of such prior-art metal film stacks 126 and 127, such as illustrated in FIGS. 2B, 3B, 4 and 5, further may have resistivities ranging from about 0.05 ohms per square ($\Omega$/sq) to about 0.5 $\Omega$/sq.

SUMMARY OF THE INVENTION

The present invention addresses these needs by providing a method of fabricating a metal film stack in an integrated circuit. An implementation of the method herein disclosed comprises depositing a metal layer on an interconnect structure, the interconnect structure comprising a plurality of isolated conducting plugs separated by an interlayer dielectric. The implementation further comprises depositing an antireflective coating layer on the metal layer. A patterned photoresist layer may be formed on the antireflective coating layer, and a metal etch step may be performed to remove portions of the antireflective coating layer and portions of the metal layer, thereby exposing at least a portion of the interlayer dielectric.

One embodiment of the present invention may be implemented in the form of an integrated circuit having a plurality of metal film stacks, wherein each metal film stack comprises a metal layer overlying one of a plurality of isolated conducting plugs disposed in an interlayer dielectric. An antireflective coating layer may overlie the metal layer.

While the apparatus and method have or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

BRIEF DESCRIPTION OF THE FIGURES

FIG. 2A is a cross-sectional diagram illustrating a result of an intermediate step in the fabrication of prior-art metal film stacks;

FIG. 2B is a cross-sectional diagram of the prior-art metal film stacks following performance of a metal etch process step on the structure of FIG. 2A;

FIG. 3A is a cross-sectional diagram illustrating a result of an intermediate step in the fabrication of another example of prior-art metal film stacks;

FIG. 3B is a cross-sectional diagram of the prior-art metal film stacks following performance of a metal etch process step on the structure shown in FIG. 3A;

FIG. 4 is a cross-sectional diagram of the prior-art metal film stacks of FIG. 2B modified to illustrate how a photolithographic registration shift can cause a contact short;

FIG. 5 is a cross-sectional diagram of the prior-art metal film stacks of FIG. 3B modified to illustrate causation of a contact short from a photolithographic registration shift;

FIG. 7A is a cross-sectional diagram illustrating a result of an intermediate step in the fabrication of an embodiment of metal film stacks according to the method of FIG. 6;

FIG. 7B is a cross-sectional diagram of the metal film stacks of FIG. 7A after a metal etch process step according to the method of FIG. 6;

FIG. 9A is a cross-sectional diagram illustrating a result of an intermediate step in the fabrication of an embodiment of metal film stacks according to the method of FIG. 8;

FIG. 9B is a cross-sectional diagram of the metal film stacks of FIG. 9A after a metal etch process step according to the method of FIG. 8;

FIG. 10 is a cross-sectional diagram of the metal film stacks of FIG. 7B modified to illustrate avoidance of a contact short even after occurrence of a photolithographic registration shift; and FIG. 11 is a cross-sectional diagram of the metal film stacks of FIG. 9B modified to illustrate avoidance of a contact short following a photolithographic registration shift condition.

DETAILED DESCRIPTION OF THE PRESENTLY PREFERRED EMBODIMENTS

Figure 1:
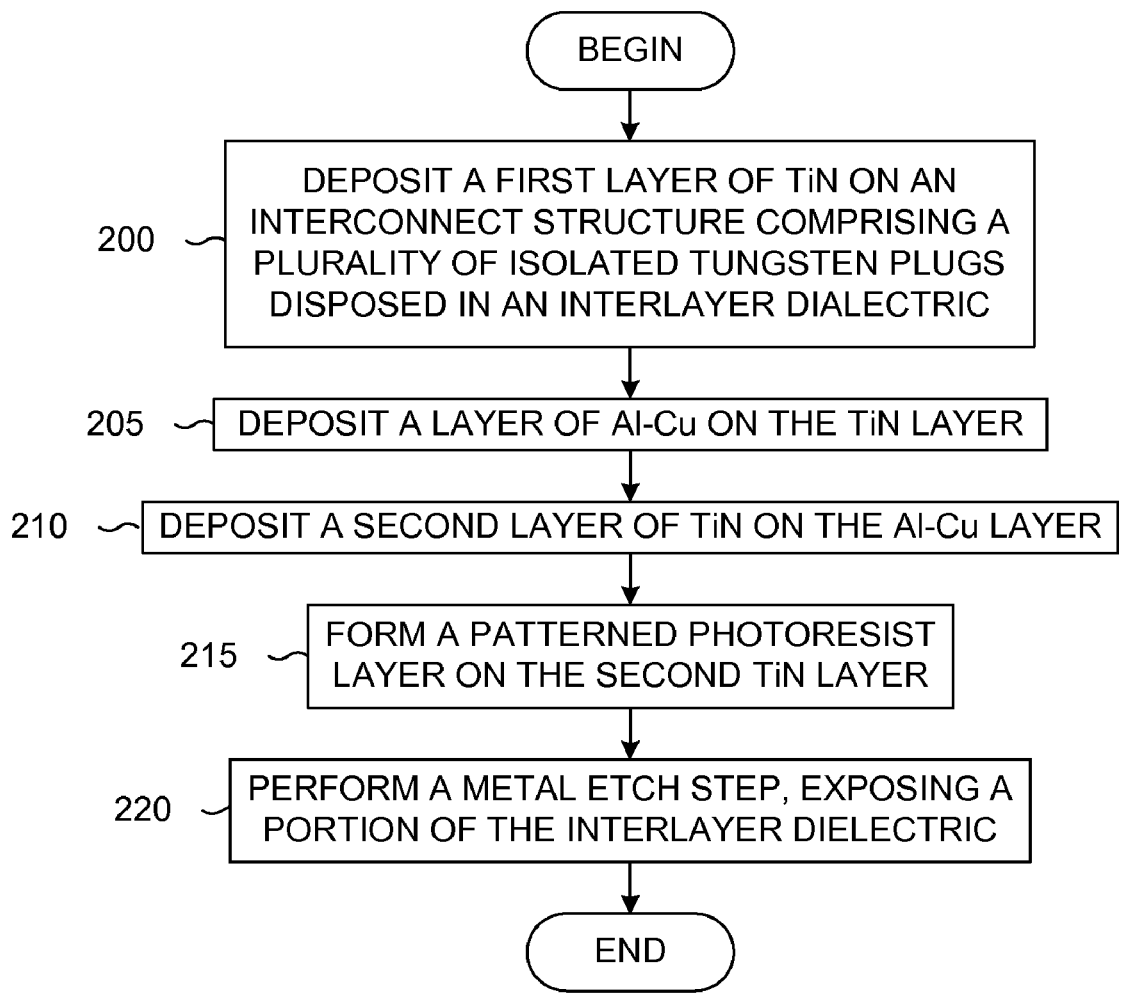
FIG. 1 is a flow diagram showing a prior-art method of forming a metal film stack.

Reference will now be made in detail to embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of metal film stacks. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to fabrication of metal film stacks.

With reference to FIGS. 1 and 2A, a prior-art method of forming metal film stacks begins with deposition of a first (barrier) layer of titanium nitride (TiN) 20 on an interconnect structure 5 at step 200. The interconnect structure 5 comprises, in a typical example, a plurality of isolated conducting plugs formed of tungsten (W) and disposed in an interlayer dielectric 10. Since the conducting plugs can take a form of either via plugs or contact plugs, they may be referenced herein as via/contact plugs. FIG. 2A illustrates two such conducting via/contact plugs in the form of a left via/contact plug 15 and a right via/contact plug 16. A metal layer 25 is formed of an aluminum-copper alloy (Al—Cu) and deposited on the first (barrier) TiN layer 20 at step 205, and a second layer 30 of TiN is deposited on the metal layer 25 at step 210. A patterned photoresist layer 40 is formed at step 215 on the second TiN layer 30, and a metal etch step is performed at step 220 to expose a portion of the interlayer dielectric 10. A structure resulting from the method of FIG. 1 is shown in FIG. 2B, including a left metal film stack 126 having a first (barrier) layer of TiN 21, a layer of Al—Cu 26, and a second layer of TiN 31 and further including a right metal film stack 127 having a first (barrier) layer of TiN 22, a layer of Al—Cu 27, and a second TiN layer 32.

According to a variant of the method, following step 210 a hard mask layer 35 is deposited on the second TiN layer 30 as shown in FIG. 3A, the hard mask layer 35 containing one or more of amorphous carbon, silicon dioxide, silicon nitride, tungsten, aluminum oxide, nickel oxide and hafnium oxide. The patterned photoresist layer 40 is then formed on the hard mask layer 35 and the metal etch step performed to produce a result as illustrated in FIG. 3B having a left metal film stack 126 with a first (barrier) layer of TiN 21, a layer of Al—Cu 26, a second layer of TiN 31 and a hard mask layer 36 and also having a right metal film stack 127 with a first (barrier) layer of TiN 22, a layer of Al—Cu 27, a second layer of TiN 32 and a hard mask layer 37.

Either of the structures illustrated in FIG. 2B and FIG. 3B may be used to interconnect upper elements located above the structure (not shown) with lower elements located below the structure (not shown). For instance, the left metal film stack 126 of FIG. 2B can connect a left upper element (not shown) to left via/contact plug 15, which may be connected to a corresponding left lower element (not shown). Similarly, the right metal film stack 127 of FIG. 2B can connect a right upper element (not shown) to right via/contact plug 16, which may be connected to a corresponding right lower element (not shown).

During formation of the patterned photoresist layer at step 215, a shift in registration of the photoresist pattern can result in a shortcoming, namely, a misalignment of the left and right metal film stacks 126 and 127. The misalignment can be to such a degree as to make the left metal film stack 126 (FIG. 2B) electrically contact the right via/contact plug 16. That is, as shown in FIG. 4, a shift in registration of the photoresist pattern can cause a contact short 60, whereby the first (barrier) TiN layer 21 makes contact with the right via/contact plug 16. Similarly, a photolithographic registration error can cause the first (barrier) TiN layer 21 of the left metal film stack 126 (FIG. 3B) to form a contact short 60 with the right via/contact plug 16 as shown in FIG. 5. Such contact shorts can adversely affect or destroy functionality of an integrated circuit that depends upon the structures illustrated in FIGS. 4 and 5 to provide interconnections among related elements of the integrated circuit.

The shortcoming of the prior-art method of FIG. 1 may be described in terms of a prior-art critical dimension 50, which may be referred to as a metal line bottom critical dimension, illustrated in FIGS. 2B and 3B. The metal line bottom critical dimension may become particularly important in the fabrication of integrated circuits having a pitch smaller than about 0.2 µm and having resistivity in a range of about 0.2 ohms per square ($\Omega$/sq) to about 0.5 $\Omega$/sq. The prior-art critical dimension 50 of FIGS. 2B and 3B may be defined as a distance between a right extent of, for example, a left metal film stack 126 and a left extent of a right via/contact plug 16. The right extent of the left metal film stack 126 in the cases of the prior-art structures of FIGS. 2B and 3B is the right extent of the first (barrier) TiN layer 21. Accordingly, it should be clear that any rightward photolithographic registration error that causes the patterned photoresist layer 40 to be displaced by more than the prior-art critical dimension 50 is likely to result in a contact short 60 between the left metal film stack 126 and the right via/contact plug 16 as shown in FIGS. 4 and 5.

Figure 6:
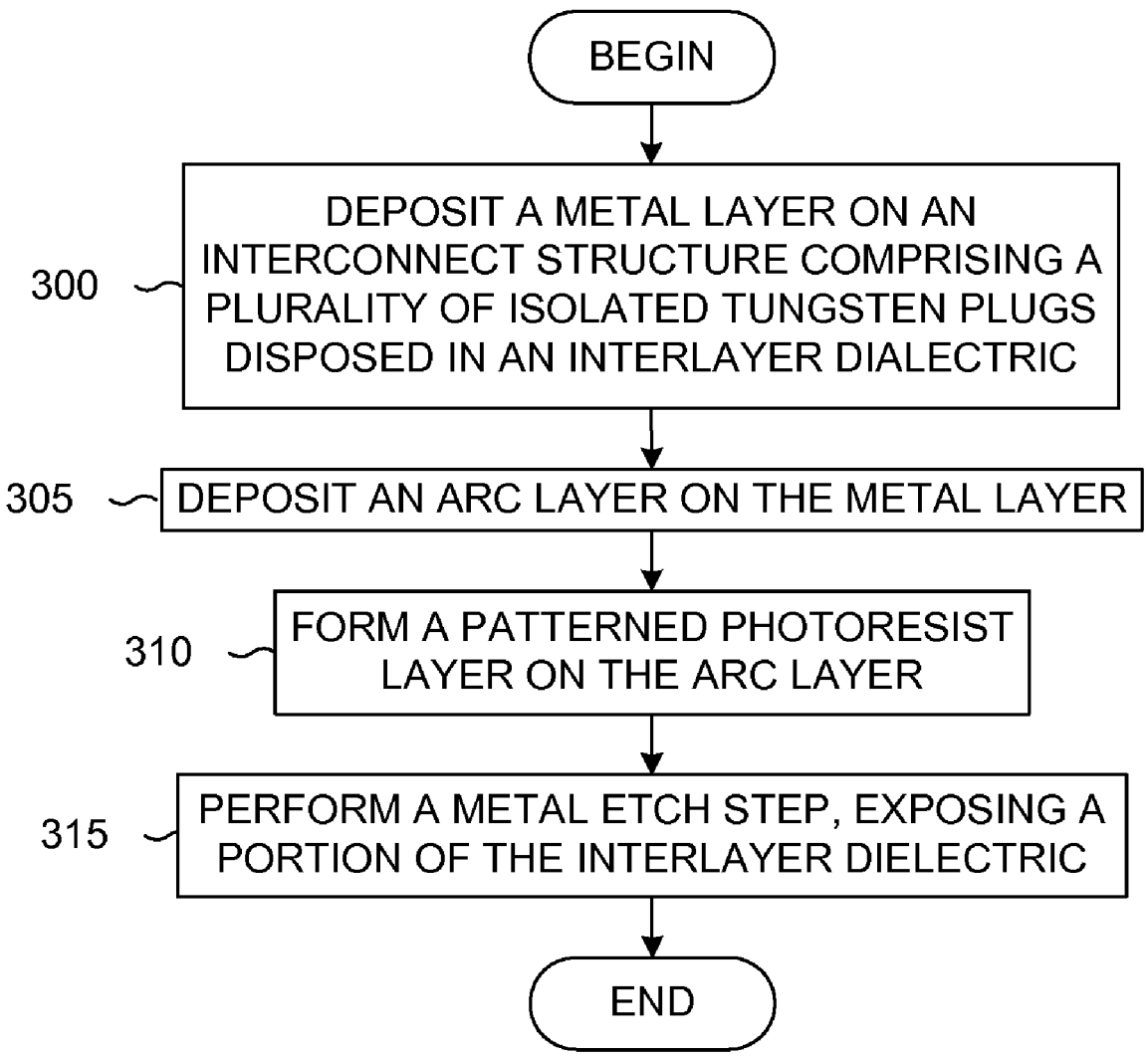
FIG. 6 is a flow diagram outlining an implementation of a method of the present invention for forming metal film stacks according to the present invention.

FIG. 6 is a flow diagram outlining an implementation of one method of the present invention for forming a metal film stack that avoids aspects of the prior-art critical dimension problem described supra. A description of the implementation may be better understood with reference to the construction of FIG. 7A. According to the method, a metal layer 25 (FIG. 7A) is deposited at step 300 on an interconnect structure 5 of a type already described. The interconnect structure 5 may comprise a plurality of conducting plugs, which may comprise via/contact plugs, examples of which are illustrated as left via/contact plug 15 and right via/contact plug 16 in FIG. 7A. The metal layer 25 may overlie, for example, an interlayer dielectric 10 and at least one member of the plurality of conducting plugs such as, for example, one or more of the left via/contact plug 15 and the right via/contact plug 16. In an exemplary embodiment, the metal layer 25 is formed of an alloy (Al—Cu) of aluminum and copper. In another embodiment, the metal layer 25 is formed of an alloy of aluminum, copper, and silicon. The thickness of the metal layer 25 may be greater than about 500 angstroms. In some embodiments, the thickness of the metal layer 25 may be greater than about 1000 angstroms. An antireflective coating (ARC) layer 30, which may be formed of, for example, titanium nitride or ceramic material, may then be deposited on the metal layer 25, and a patterned photoresist layer 40 may be formed on the ARC layer 30 at step 310. A metal etch process may be employed at step 315 to remove a portion of the ARC layer 30 and the metal layer 25 in order to expose a portion of the interlayer dielectric 10.

FIG. 7B illustrates a result of applying the method described in FIG. 6. In particular, a plurality of metal film stacks is formed. For example, FIG. 7B shows a left metal film stack 126 comprising a metal layer 26 and an ARC layer 31 and, further, shows a right metal film stack 127 comprising a metal layer 27 and an ARC layer 32. FIG. 7B also illustrates an improvement in a critical dimension, which may be defined, as before, as a distance between, for example, a right extent of a left metal film stack 126 and a left extent of a right via/contact plug 16. In the present instance, the right extent of the left metal film stack 126 is the right extent of the metal layer 26. The critical dimension is referenced in FIG. 7B as 51, wherein the prior-art critical dimension 50 is also shown for comparison. A rightward photolithographic registration error that causes the patterned photoresist layer 40 to be displaced by more than the prior-art critical dimension 50 but less than the (larger) critical dimension 51 does not, as illustrated in FIG. 10, cause a contact short between the left metal film stack 126 and the right via/contact plug 16.

Figure 8:
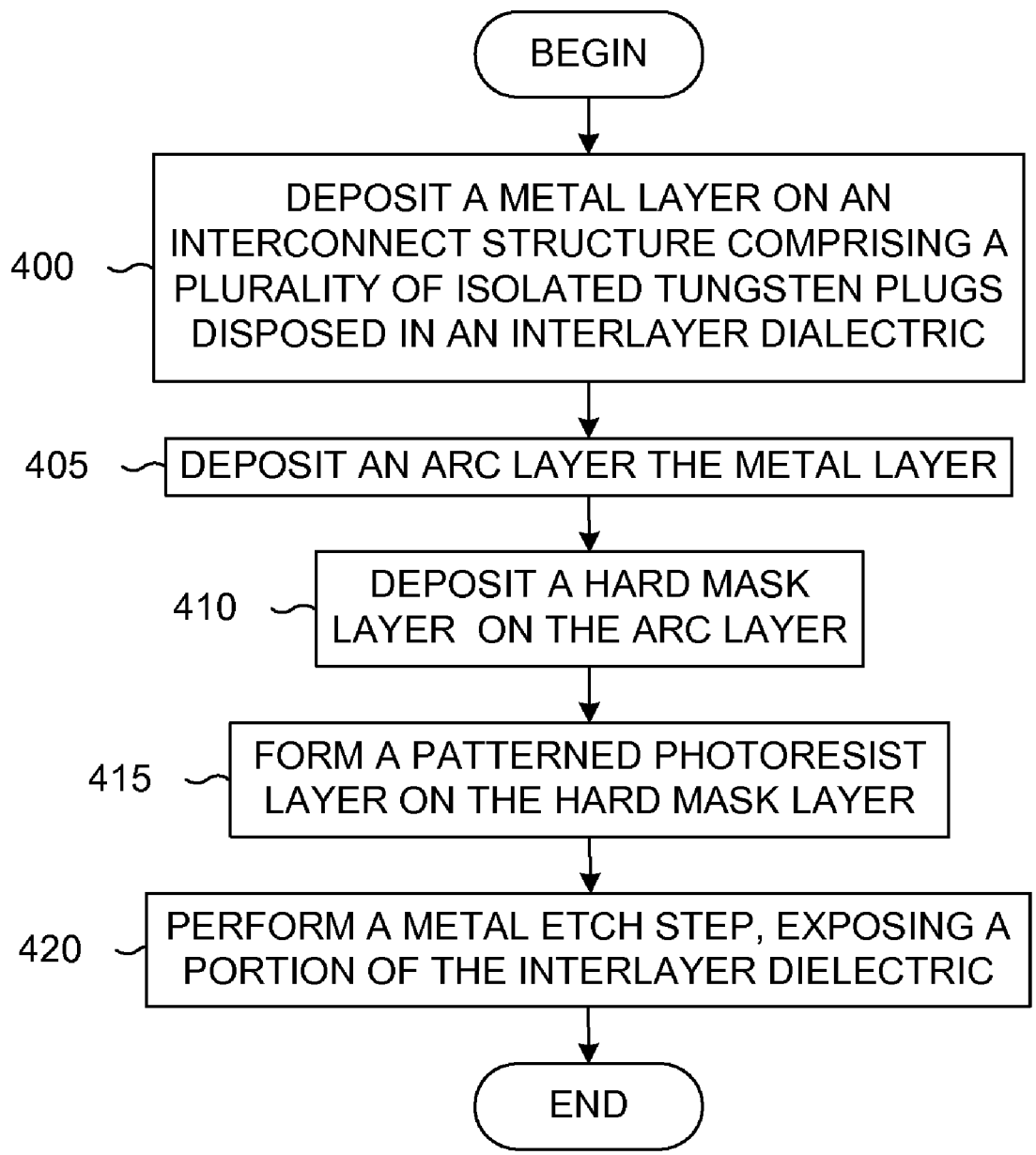
FIG. 8 is a flow diagram summarizing an implementation of another method of forming metal film stacks according to the present invention.

As another example, the implementation of the method described in FIG. 6 may be modified to the form of FIG. 8 in which steps 400 and 405 can be identical to respective steps 300 and 305 of FIG. 6. With reference to FIG. 9A, a hard mask layer 35 may be deposited at step 410 (FIG. 8), and a patterned photoresist layer 40 may be formed on the hard mask layer 35 at step 415. A metal etch step may then be performed at step 420 to expose portions of the interlayer dielectric 10 as illustrated in FIG. 9B. As before, the aforementioned steps may result in formation of a plurality of metal film stacks including, for example, a left metal film stack 126 comprising a metal layer 26, an ARC layer 31, and a hard mask layer 36. Further, the right metal film stack 127 may be formed, the right metal film stack 127 comprising a metal layer 27, an ARC layer 32, and a hard mask layer 37.

Comparing FIG. 9B with the prior-art result illustrated in FIG. 3B, it can be observed that the prior-art critical dimension 50 in FIG. 3B is replaced by a (larger) critical dimension 51 in FIG. 9B. Continuing, as is illustrated in FIG. 11, a rightward photolithographic registration error greater than the prior-art critical dimension 50 but less than the critical dimension 51 does not cause a contact short between the left metal film stack 126 and the right via/contact plug 16.

In view of the foregoing, it will be understood by those skilled in the art that the methods of the present invention can facilitate fabrication of metal film stacks with an improved bottom critical dimension in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of fabricating a metal film stack in an integrated circuit, the method comprising:
    depositing a homogeneous metal layer directly on an interconnect structure, the interconnect structure including a plurality of isolated conducting plugs arranged within an interlayer dielectric;
    depositing an antireflective coating layer directly on the metal layer; and
    forming hardmask and photoresist layers thereover.

2. The method as set forth in claim 1, wherein the metal layer is an alloy of aluminum and copper.

3. The method as set forth in claim 1, wherein the metal layer is an alloy of aluminum, silicon and copper.

4. The method as set forth in claim 1, wherein each isolated conducting plug comprises one of a via plug and a contact plug.

5. The method as set forth in claim 1, wherein the antireflective coating layer comprises a ceramic material.

6. The method as set forth in claim 1, wherein the antireflective coating layer comprises titanium nitride.

7. The method as set forth in claim 1, further comprising:
    forming a patterned photoresist layer on the antireflective coating layer; and
    performing a metal etch step to remove portions of the antireflective coating layer and portions of the metal layer.

8. The method as set forth in claim 7, wherein the performing exposes at least a portion of the interlayer dielectric.

9. The method as set forth in claim 8, wherein the performing further places at least a portion of the metal film stack in contact with at least one conducting plug.

10. The method as set forth in claim 1, further comprising:
    depositing a hard mask layer on the antireflective coating layer;
    forming a patterned photoresist layer on the hard mask layer; and
    performing a metal etch step to expose at least a portion of the interlayer dielectric.

11. An integrated circuit having a plurality of metal film stacks, each metal film stack comprising:
    a homogeneous metal layer that overlies and directly contacts an interlayer dielectric and at least one of a plurality of isolated conducting plugs disposed within the interlayer dielectric;
    an antireflective layer that overlies the metal layer; and
    hardmask and photoresist layers formed thereover.

12. The integrated circuit as set forth in claim 11, further comprising a hard mask that overlies the metal layer.

13. The integrated circuit as set forth in claim 11, wherein a resistivity of the film stack is less than about 0.5 ohms per square.

14. The integrated circuit as set forth in claim 11, wherein the thickness of the metal layer is greater than about 500 angstroms.

15. The integrated circuit as set forth in claim 11, wherein the thickness of the metal layer is greater than about 1000 angstroms.

16. An integrated circuit having a plurality of metal structures, each metal structure comprising:
    a plurality of conductive plugs separated by a dielectric layer;
    a homogeneous conductive layer directly disposed on and contacting both the plurality of conductive plugs and the dielectric layer, the conductive layer having a thickness greater than about 500 angstroms;
    an antireflective layer overlying the conductive layer; and
    hardmask and photoresist layers formed thereover.

17. The integrated circuit as set forth in claim 16, wherein the conductive layer is formed of an alloy of aluminum and copper.

18. The integrated circuit as set forth in claim 17, wherein the alloy comprises silicon.

19. The integrated circuit as set forth in claim 16, further comprising a hard mask overlying the conductive layer.

20. The integrated circuit as set forth in claim 16, wherein the thickness of the conductive layer is greater than 1000 angstroms.

* * * * *